(12) United States Patent
Adusumilli et al.

(10) Patent No.: US 10,147,680 B2
(45) Date of Patent: *Dec. 4, 2018

(54) METHOD TO REDUCE VARIABILITY IN CONTACT RESISTANCE

(71) Applicant: International Business Machines Corporation, Armonk, NY (US)

(72) Inventors: Praneet Adusumilli, Albany, NY (US); Hemanth Jagannathan, Niskayuna, NY (US); Christian Lavoie, Pleasantville, NY (US); Jean L. Sweet, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/809,261

(22) Filed: Nov. 10, 2017

(65) Prior Publication Data

US 2018/0226352 A1     Aug. 9, 2018

Related U.S. Application Data

(63) Continuation of application No. 15/425,162, filed on Feb. 6, 2017, now Pat. No. 9,837,357.

(51) Int. Cl.
*H01L 21/8238* (2006.01)
*H01L 23/532* (2006.01)
(Continued)

(52) U.S. Cl.
CPC .... *H01L 23/53209* (2013.01); *H01L 21/2053* (2013.01); *H01L 21/324* (2013.01);
(Continued)

(58) Field of Classification Search
CPC . H01L 21/04; H01L 21/2018; H01L 21/2053; H01L 21/38; H01L 21/40;
(Continued)

(56) References Cited

U.S. PATENT DOCUMENTS

| 4,874,717 A | 10/1989 | Neppl et al. |
| 6,241,859 B1 | 6/2001 | Yamada et al. |

(Continued)

OTHER PUBLICATIONS

Ageev, V., et al., "Kinetics of silicon interaction with textured tantalum ribbons", Physics of the Solid State, Aug. 1997, pp. 1318-1323, vol. 39, No. 8.

(Continued)

*Primary Examiner* — Cheung Lee
(74) *Attorney, Agent, or Firm* — Fleit Gibbons Gutman Bongini Bianco PL; Jose Gutman

(57) ABSTRACT

Various methods and semiconductor structures for fabricating at least one FET device having textured gate-source-drain contacts of the FET device that reduce or eliminate variability in parasitic resistance between the contacts of the FET device. An example fabrication method includes epitaxially growing a source-drain contact region on an underlying semiconductor substrate of one of a pFET device or an nFET device. The method deposits a bottom film layer directly on the epitaxially grown source-drain contact region. A first anneal forms a textured bottom silicide film layer directly on the epitaxially grown source-drain contact region. A top metal film layer is deposited on the textured bottom silicide film layer. A second anneal forms a textured top metal silicide film layer. The method can be repeated on the other one of the pFET device or the nFET device.

20 Claims, 15 Drawing Sheets

(51) Int. Cl.
*H01L 27/092* (2006.01)
*H01L 23/528* (2006.01)
*H01L 21/8234* (2006.01)
*H01L 21/205* (2006.01)
*H01L 21/324* (2006.01)

(52) U.S. Cl.
CPC .......... *H01L 21/823418* (2013.01); *H01L 21/823814* (2013.01); *H01L 21/823871* (2013.01); *H01L 23/528* (2013.01); *H01L 27/092* (2013.01)

(58) Field of Classification Search
CPC ....... H01L 21/46; H01L 21/70; H01L 21/702; H01L 21/8232
See application file for complete search history.

(56) References Cited

U.S. PATENT DOCUMENTS

| | | |
|---|---|---|
| 6,774,023 B1 | 8/2004 | Paek et al. |
| 7,217,657 B2 | 5/2007 | Wieczorek et al. |
| 7,611,943 B2 | 11/2009 | Liu |
| 8,629,510 B2 | 1/2014 | Alptekin et al. |
| 2014/0106531 A1 | 4/2014 | Cabral, Jr. et al. |

OTHER PUBLICATIONS

Akhavan, O., et al., "Self-encapsulation of single-texture CoSi2 nanolayer by TaSi2", Thin Solid Films, Jul. 2008, pp. 6008-6012, vol. 516, No. 18.

Li, D., et al., "Novel Schottky Barrier MOSFET with Dual-layer Silicide Source/Drain Structure", Proceedings of the Seventh International Conference on Solid-State and Integrated Circuits Technology, Oct. 18-21, 2004, pp. 1-4.

Milanese, C., et al., "Reactive Growth of Tantalum Silicides in Ta-Si Diffusion Couples", Journal of Physical Chemistry, May 2002, pp. 5859-5863, vol. 106, No. 23.

Notice of Allowance for U.S. Appl. No. 15/425,162, dated Aug. 2, 2017.

METHOD TO REDUCE VARIABILITY IN CONTACT RESISTANCE

BACKGROUND OF THE INVENTION

The present invention generally relates to the field of semiconductors, and more particularly relates to a method of fabricating source-drain contacts, and/or gate contact, on semiconductor structures.

Silicide/source-drain interface resistance is a major contributor to the total external parasitic resistance of a semiconductor contact. As the source-drain contact dimensions are aggressively scaled, it can increase variability in contact resistance within a CMOS device or between various devices. New semiconductor fabrication approaches are needed to reduce the variability in contact resistance.

SUMMARY OF THE INVENTION

A method for fabrication of semiconductor structures having source-drain contacts, and/or gate contacts, with reduced, or entirely eliminated, variability in contact resistance.

According to various embodiments, a fabrication method reduces variability in contact resistance, where the contact may be a source-drain contact or a gate contact. The contact resistance variability is reduced by the formation of textured silicides in the contact. Textured silicides can have an epitaxial relationship, e.g., substantially the same crystal orientation (also referred to as grain orientation), with the underlying source-drain contact material, or the gate contact material. This epitaxial relationship can result in the Shottky barrier height and specific contact resistivity being substantially the same across all contacts in a semiconductor device and/or across semiconductor devices.

According to one embodiment, a method for fabricating a semiconductor structure reduces variability in source-drain contact resistance in nFET devices and/or pFET devices. The method includes: following epitaxially growing a contact region on a semiconductor substrate, wherein the contact region comprises one contact region selected from the set of: a source-drain contact region, or a gate contact region, perform deposition of a bottom textured silicide film layer having one orientation on the epitaxially grown contact region; and following the deposition of the bottom textured silicide film layer, perform deposition of a top textured silicide film layer having the one orientation on the bottom textured silicide film layer, the bottom textured silicide film layer interposed between the top textured silicide film layer and the epitaxially grown contact region.

The method for fabricating a semiconductor structure can use a soft mask to selectively protect one of an nFET device or a pFET device, while performing the deposition of the bottom textured silicide film layer and the deposition of the top textured silicide film layer for forming a textured silicide contact for the other one of the nFET device or the pFET device.

According to another embodiment, a semiconductor structure includes a substrate; at least one epitaxially grown source-drain contact region disposed on the semiconductor substrate; a top textured silicide film layer disposed on the at least one epitaxially grown source-drain contact region, the a top textured silicide film layer having a preferred grain orientation that is oriented to a grain orientation of the at least one epitaxially grown source-drain contact region; and an interfacial bottom textured silicide film layer interposed between the top textured silicide film layer and the at least one epitaxially grown source-drain contact region, the bottom textured silicide film layer also having a preferred grain orientation that is oriented to a grain orientation of the at least one epitaxially grown source-drain contact region.

According to various embodiments, the bottom textured silicide film layer is chemically different from the top textured silicide film layer.

The semiconductor device, according to certain embodiments, can include at least one nFET device, at least one pFET device, or a plurality of at least one nFET device and at least one pFET device.

According to certain embodiments, the interfacial bottom silicide film layer and the top textured silicide film layer wrap around the at least one epitaxially grown source-drain contact region thereby forming a wrap-around contact with increased contact length and lower contact resistance.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
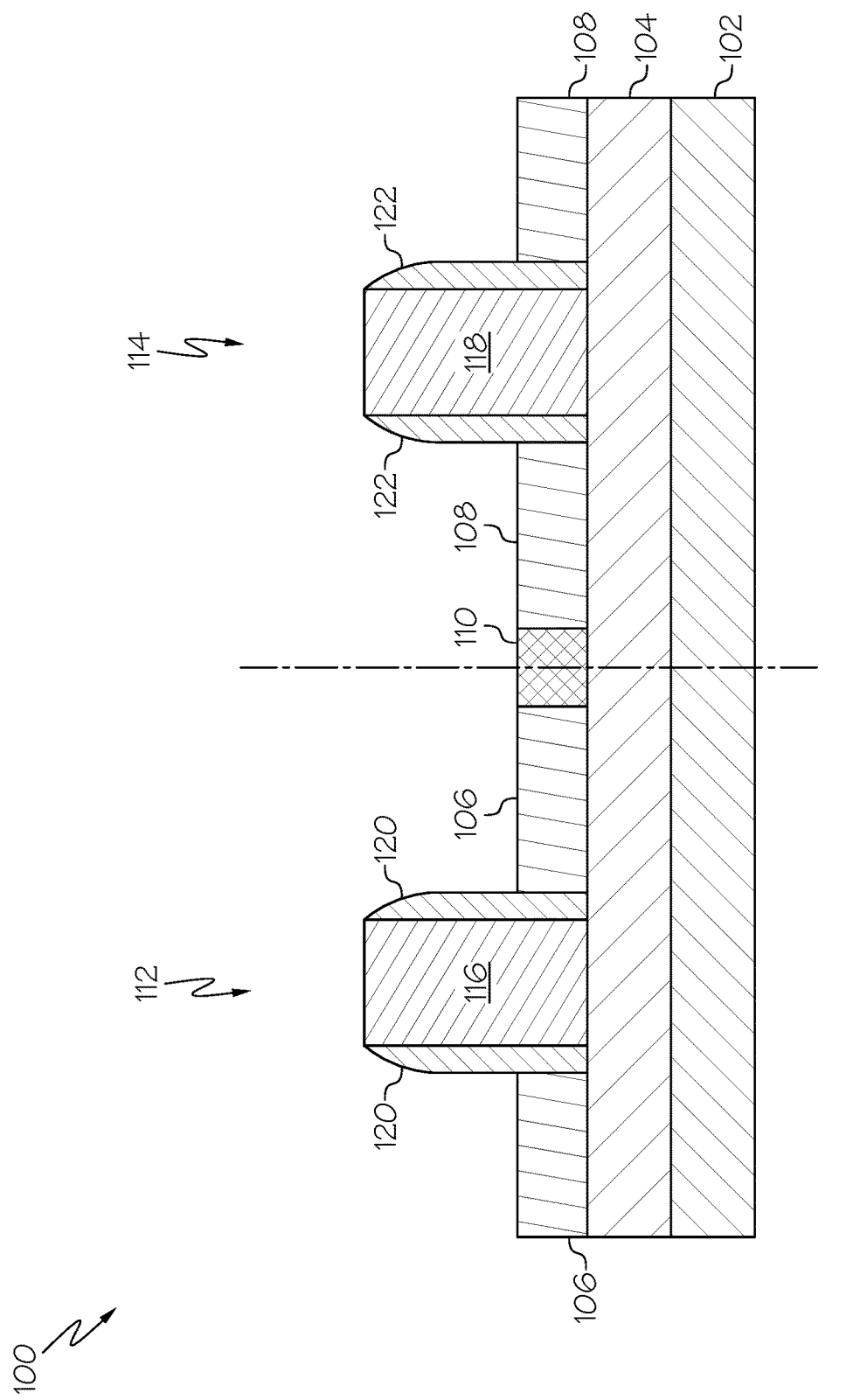
FIG. 1 is a cross-sectional view of a partial semiconductor structure in a first step of a first example process of fabricating semiconductor devices, according to an embodiment of the present invention.

It is to be understood that the present invention will be described in terms of given illustrative example processes for fabricating source-drain silicide interface contacts in semiconductor devices. However, other semiconductor architectures, structures, substrate materials, and process features and steps can be varied within the scope of the present invention. For example, processes for fabricating gate stack silicide contacts in semiconductor devices are also envisioned according to various embodiments of the invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present example embodiments include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used as part of a process in the fabrication of integrated circuit chips. The resulting integrated circuit chips can be distributed by the fabricator in raw wafer form (that is, as a single wafer that has a plurality of unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips (or CMOS integrated circuit on a chip), ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Various embodiments of the present invention include a semiconductor structure having source contacts and drain contacts on the same wafer. This semiconductor structure can be used to create CMOS devices in a CMOS integrated circuit.

Silicide/source-drain interface resistance is a major contributor to the total external parasitic resistance of source-drain contacts. Aggressive dimensional scaling can introduce variability in contact resistance due to grain orientation dependent Schottky barrier heights. Highly scaled CMOS contacts can include a single grain or a few grains—thus increasing the variability in parasitic resistance within a CMOS device or between various semiconductor devices.

The inventors have discovered that this variability in parasitic resistance of contacts within an FET device or between various devices (e.g., CMOS devices and CMOS integrated circuits) can be significantly reduced, or eliminated, by the formation of textured silicides. Textured silicides typically include silicide films that have an epitaxial relationship with the underlying contact material (e.g., gate-source-drain material). Such epitaxial relationship with the underlying contact material ensures the same crystal orientation (grain orientation), and consequently the same Schottky barrier heights and specific contact resistivity, across all gate-source-drain contacts in a semiconductor device or even across semiconductor devices on a wafer.

An epitaxial relationship between the silicide metal film and the source-drain material helps improve the morphological stability of the silicide metal film. A morphologically stable silicide contact material can withstand high temperature processing in a semiconductor fabrication process. This epitaxial relationship also protects against agglomeration during downstream high temperature processing.

It is possible to fabricate textured silicide metal films by the insertion of a very thin Nickel (Ni) silicide or Nickel silicide germanide layer between, for example, the epitaxially grown source-drain contact region of a contact in a semiconductor device and a silicide metal film layer (e.g., Tantalum (Ta)) deposited thereon. The composition of the Nickel layer can include a low concentration alloy combined with silicide Nickel metal. The composition of the silicide metal film layer material, according to various examples, can include any one or more of the following: Tantalum (Ta), Titanium (Ti), Zirconium (Zr), Hafnium (Hf), Vanadium (Va), Niobium (Nb), Molybdenum (Mo), Tungsten (W), or the like.

This thin Ni silicide layer helps silicide formation in at least two ways. First, it makes silicide film formation easier, e.g., $TaSi_2$ silicide formation is possible at lower temperatures. Secondly, this thin Ni silicide layer helps formation of texture of a silicide film layer. For example, the Ni silicide layer helps formation of textured silicide metal film layers with a preferred orientation (grain orientation) to the underlying substrate layer, e.g., the epitaxially grown source-drain contact region of a contact in a semiconductor device.

Since these textured silicide metal films are stable at high temperatures, they can be integrated prior to replacement metal gate (RMG) fabrication in a process flow. Ni layer deposition can be used for both nFET and pFET devices. This fabrication process can be used for source-drain contacts.

This fabrication process can also be used for gate contacts. That is, for example, at least one epitaxially grown gate contact region can be disposed on a semiconductor substrate. At least one textured silicide contact can be disposed on the at least one epitaxially grown gate contact region. An interfacial Nickel silicide film layer can be interposed between the at least one textured silicide contact and the at least one epitaxially grown gate contact region, the at least one textured silicide contact, the at least one epitaxially grown gate contact region, and the interfacial Nickel silicide film layer interposed therebetween, forming at least one gate contact for at least one FET device.

According to various embodiments of the invention, a semiconductor fabrication process includes formation of a two layer, textured silicide contact, which will help minimize the variability in contact resistivity in nFET and pFET devices. In a semiconductor fabrication process, silicide materials can have different crystallites or grains as part of the materials. The grains can be oriented in different directions for particular silicide materials. Depending on the grains orientation the Shottky barrier height and the parameters that defines contact resistance might be different.

A semiconductor fabrication method, according to various embodiments, controls the direction of orientation of the grains of two textured silicide film layers disposed one layer on top of the other layer, and how the grains are aligned to the underlying substrate, e.g., the epitaxially grown source-drain contact region material of a contact in a semiconductor device. When a fabrication process controls the orientation of the grains it also controls the Shottky barrier height in each contact of a semiconductor device. Additionally, according to various embodiments, a fabrication process can control the Shottky barrier height in each contact across many different devices and in each contact across many chips. This fabrication process can control the Shottky barrier height in contacts in CMOS devices, and in contacts across different CMOS devices and CMOS integrated circuits.

The orientation of the grains of the bottom epitaxial or textured silicide film layer of preferentially oriented silicide material defines the orientation of the top silicide film layer. The bottom silicide film layer forms a template on which the top silicide film layer grows. The orientation of both textured silicide film layers is determined by the orientation of the bottom silicide film layer.

The bottom silicide film layer is chemically different from the top silicide film layer. The bottom silicide film layer can be Nickel silicide or Nickel silicide germanide. The top second metal silicide film layer is formed using metals including, for example, any one or more of the following: Tantalum (Ta), Titanium (Ti), Zirconium (Zr), Hafnium (Hf), Vanadium (Va), Niobium (Nb), Molybdenum (Mo), Tungsten (W), or the like. Two example fabrication processes will be discussed below.

It should be noted that, according to certain embodiments, an interfacial Nickel silicide film layer and a textured silicide metal contact wrap around the at least one epitaxially grown source-drain contact region thereby forming a wrap-around contact with increased contact length and lower contact resistance.

Early Silicide Example Process

This example semiconductor device fabrication process 1400 will be discussed below with reference to FIGS. 1 to 8 and 14, and to a semiconductor structure 100. The silicide formation, according to the example, occurs before a dummy gate is replaced with an actual gate in a process called replacement metal gate, as will be discussed below.

With particular reference to FIG. 1, an nFET semiconductor device 112 and a pFET semiconductor device 114 are disposed on a circuit supporting substrate 104 that is disposed on a substrate 102. The FET devices 112, 114, according to the example, are separated by dielectric material 110, e.g., by oxide deposition filling an etched region. Such dielectric material 110 may comprise shallow trench isolation (STI) material 110.

Figure 2:
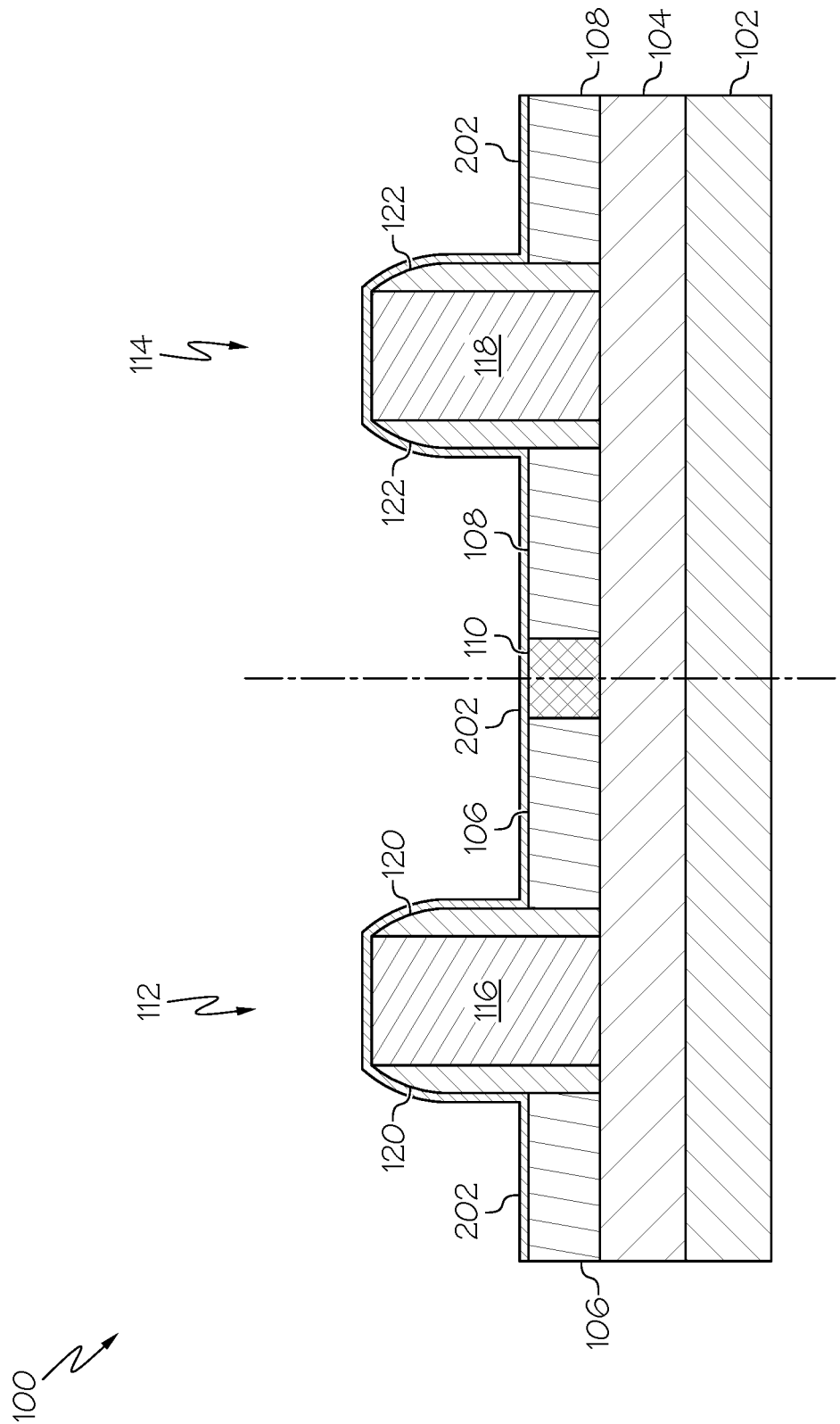
FIG. 2 is a cross-sectional view of the partial semiconductor structure in a second step of the continuing first example process of fabricating semiconductor devices.

At this point in the fabrication process, entered at step 1402 and proceeding to step 1404, each FET device 112, 114, includes a respective dummy gate 116, 118, made of, for example, amorphous silicon. Spacers 120, 122, formed on either side of the respective dummy gates 116, 118, comprise for example silicon nitride material. A silicon fin 106, in the nFET device 112, or a silicon germanium fin 108, in the pFET device 114, provide a channel which is the active region controlled by the gate of the respective FET device 112, 114. As shown in FIG. 2, a silicon nitride cap 202 covers the dummy gates 116, 118, spacers 120, 122, and fins 106, 108, in the respective FET devices 112, 114, as shown. The silicide formation, in the early silicide example process, occurs before a dummy gate is replaced with an actual gate in a process called replacement metal gate.

Figure 3:
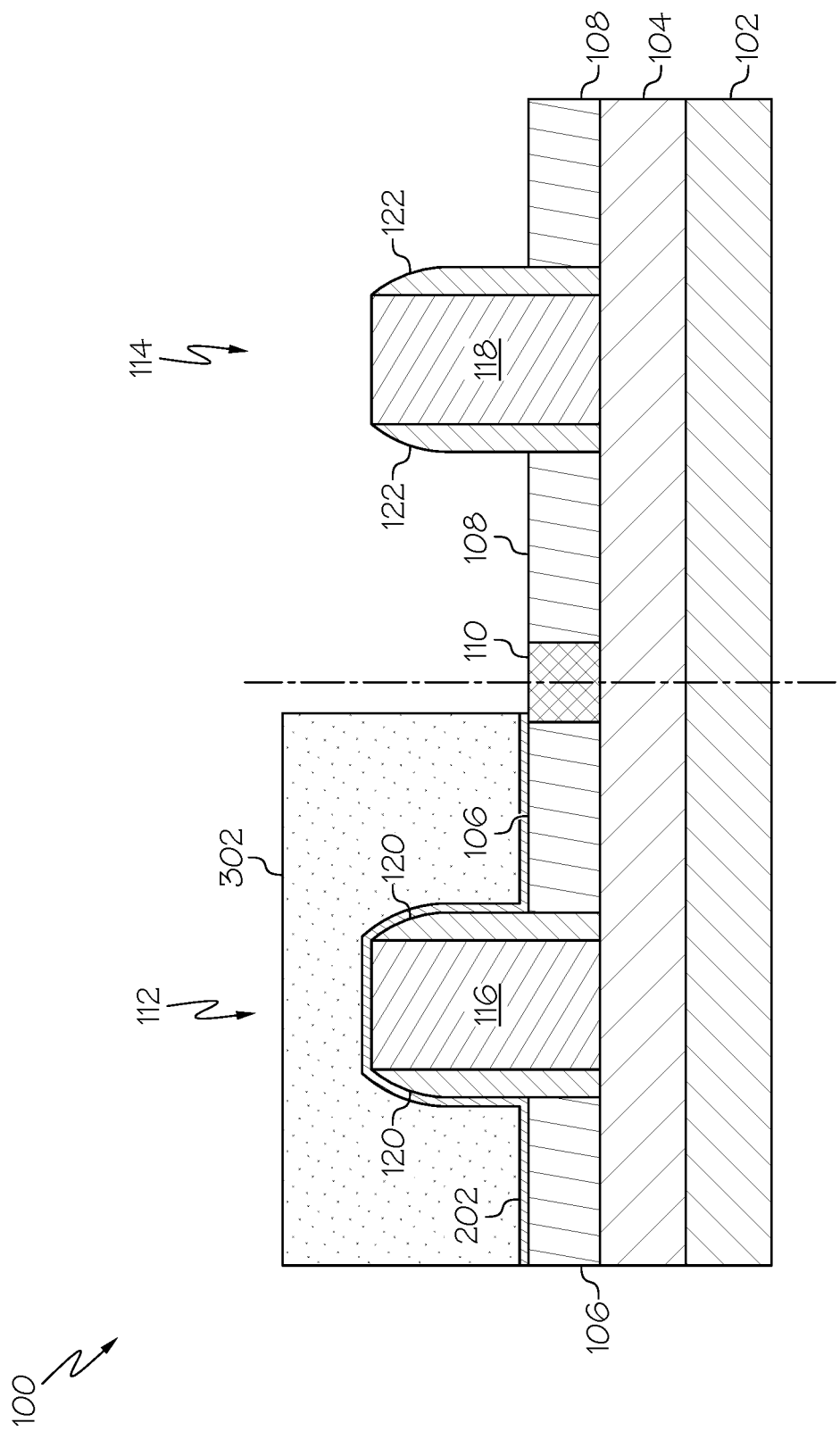
FIG. 3 is a cross-sectional view of the partial semiconductor structure in a third step of the continuing first example process of fabricating semiconductor devices.

As shown in FIG. 3, according to the process step 1404, the nFET device is protected with a soft mask 302. The silicon nitride cap is etched away from the pFET device, as shown, and the silicon germanium fin 108 is exposed.

Figure 4:
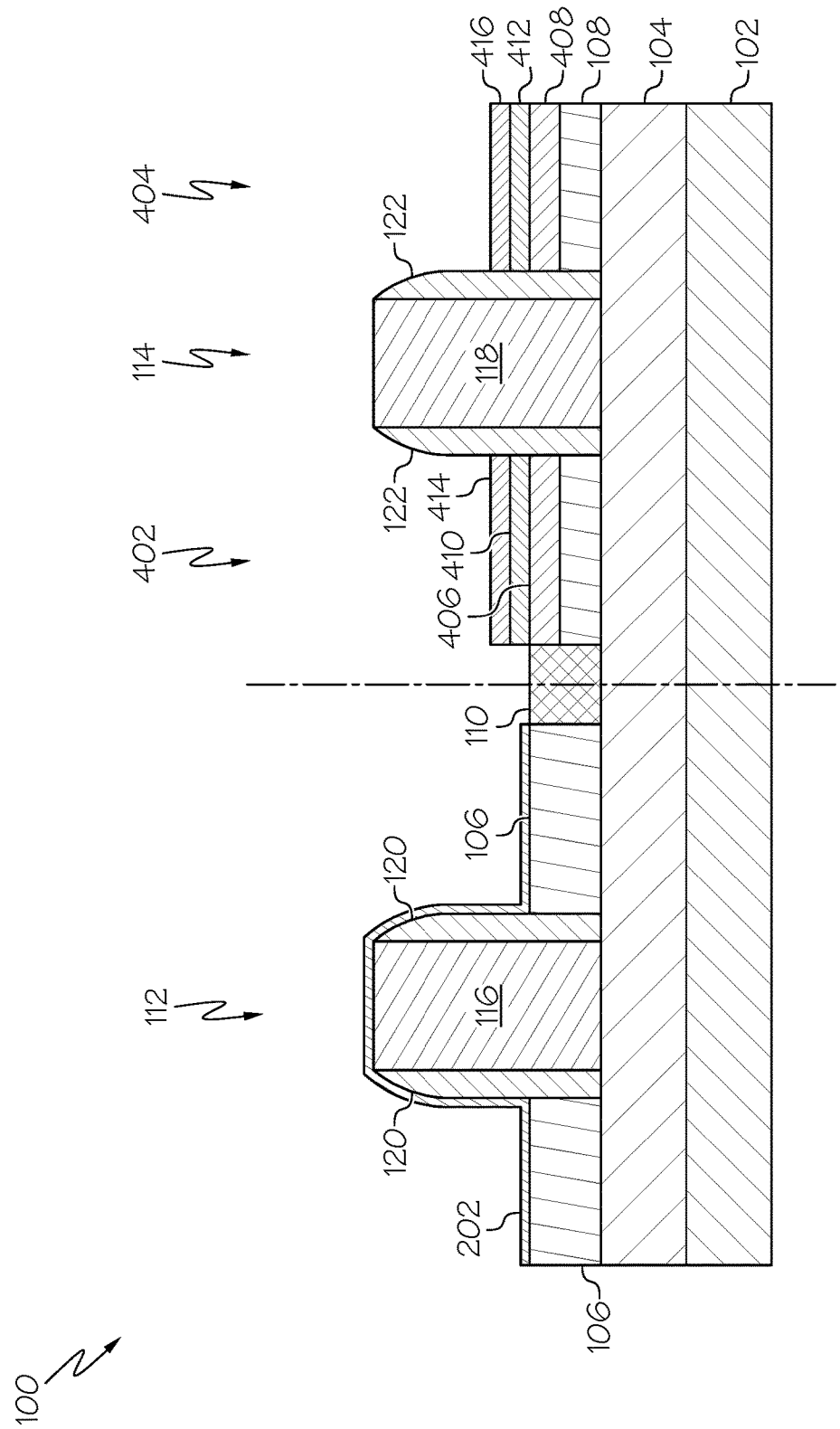
FIG. 4 is a cross-sectional view of the partial semiconductor structure in a fourth step of the continuing first example process of fabricating semiconductor devices.

The nFET side is protected with the nitride cap and the pFET device is open with the silicon germanium fin 108 exposed. The fabrication process, as shown in FIG. 4, according to the process step 1406, has epitaxially grown semiconductor material to form source-drain contacts 402, 404 corresponding to the epitaxially grown source-drain contact regions 406, 408, on the underlying semiconductor substrate 108 of the pFET device 114. The fabrication process removes the soft mask 302 that was protecting the nFET device 112.

Nickel is deposited across the semiconductor structure 100, such as across an entire wafer. On the pFET device 114 this forms a thin Nickel film layer 410, 412, on the epitaxially grown source-drain contact regions 406, 408. The process then performs a first anneal to form a Nickel silicide film layer or a Nickel silicide germanide film layer on the epitaxially grown source-drain contact regions 406, 408. The Nickel silicide film layer or Nickel silicide germanide film layer 410, 412 is formed with grains preferentially oriented to the underlying epitaxially grown source-drain contact regions 406, 408. It should be noted that the Nickel film layer (and accordingly a textured Nickel film layer) can be formed by at least one of physical vapor deposition, chemical vapor deposition, or atomic layer deposition.

The fabrication process 1400, at step 1408, then deposits a second metal film layer 414, 416 on the Nickel silicide germanide film layer 410, 412. The second metal film layer 414, 416 can include, for example, any one or more of the following: Tantalum (Ta), Titanium (Ti), Zirconium (Zr), Hafnium (Hf), Vanadium (Va), Niobium (Nb), Molybdenum (Mo), Tungsten (W), or the like. This deposition is followed by a second anneal to form the preferentially oriented second metal silicide film layer 414, 416 on top of the Nickel silicide germanide film layer 410, 412. It should be noted that the second metal film layer (and accordingly the textured second metal silicide film layer) can be formed by at least one of physical vapor deposition, chemical vapor deposition, or atomic layer deposition. The second metal silicide film layer 414, 416 is formed with grains preferentially oriented to the first silicide film layer being the Nickel silicide film layer 410, 412, which is preferentially oriented to the underlying epitaxially grown source-drain contact regions 406, 408. That is, the orientation of the grains of the bottom textured silicide film layer 410, 412 (e.g., of the preferentially oriented Nickel silicide material or Nickel silicide germanide material) defines the orientation of the grains of the top silicide layer 414, 416 (e.g., of the preferentially oriented second metal silicide material that can be selected from, for example, any one or more of Ta, Ti, Zr, Hf, Va, Nb, Mo, W, or the like). The bottom layer 410, 412 forms a template on which the top layer 414, 416 grows. The orientation of both silicide layers 410, 412, 414, 416 is determined by the orientation of the bottom silicide layer 410, 412. FIG. 4 illustrates a point in the fabrication process AFTER the formation of both top and bottom textured silicide layers 410, 412, 414, 416.

The process then, at step 1408, uses a wet chemistry to remove the unreacted metal from the pFET and nFET devices 114, 112. Since the nFET device region 112 has been protected by the nitride cap 202, all of the unreacted metal deposited on the nitride cap 202 will be removed.

Figure 5:
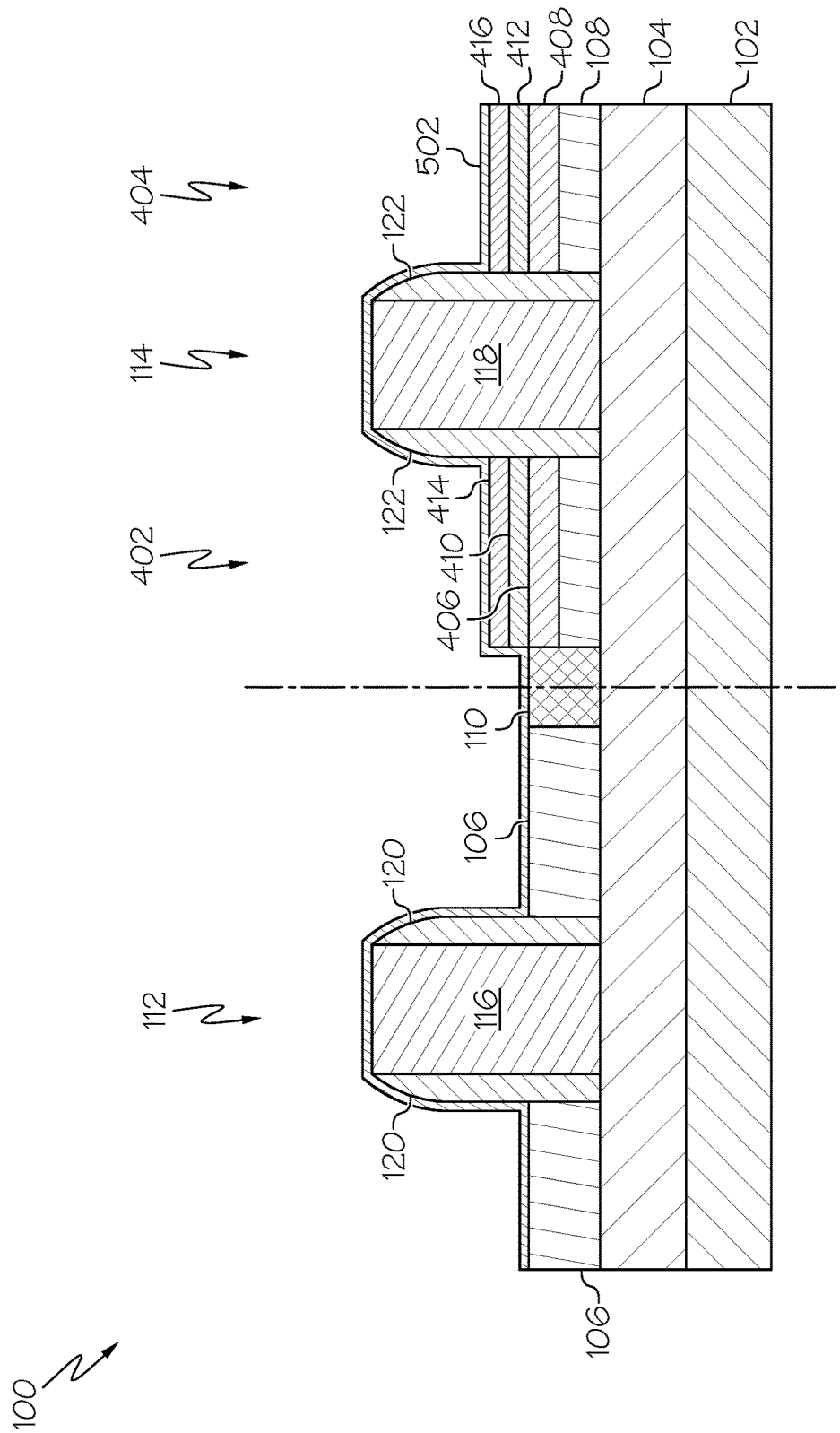
FIG. 5 is a cross-sectional view of the partial semiconductor structure in a fifth step of the continuing first example process of fabricating semiconductor devices.
Figure 6:
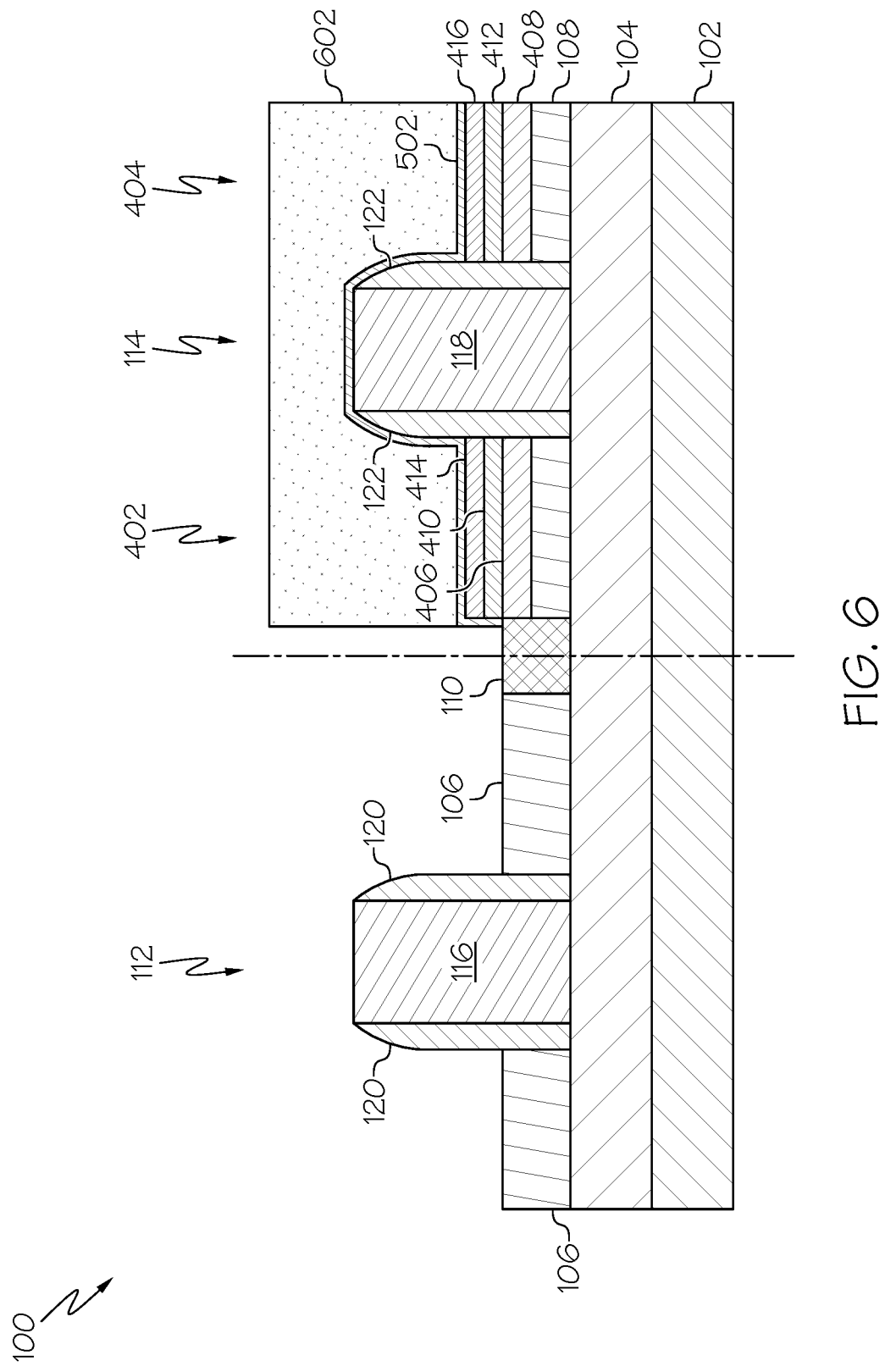
FIG. 6 is a cross-sectional view of the partial semiconductor structure in a sixth step of the continuing first example process of fabricating semiconductor devices.
Figure 7:
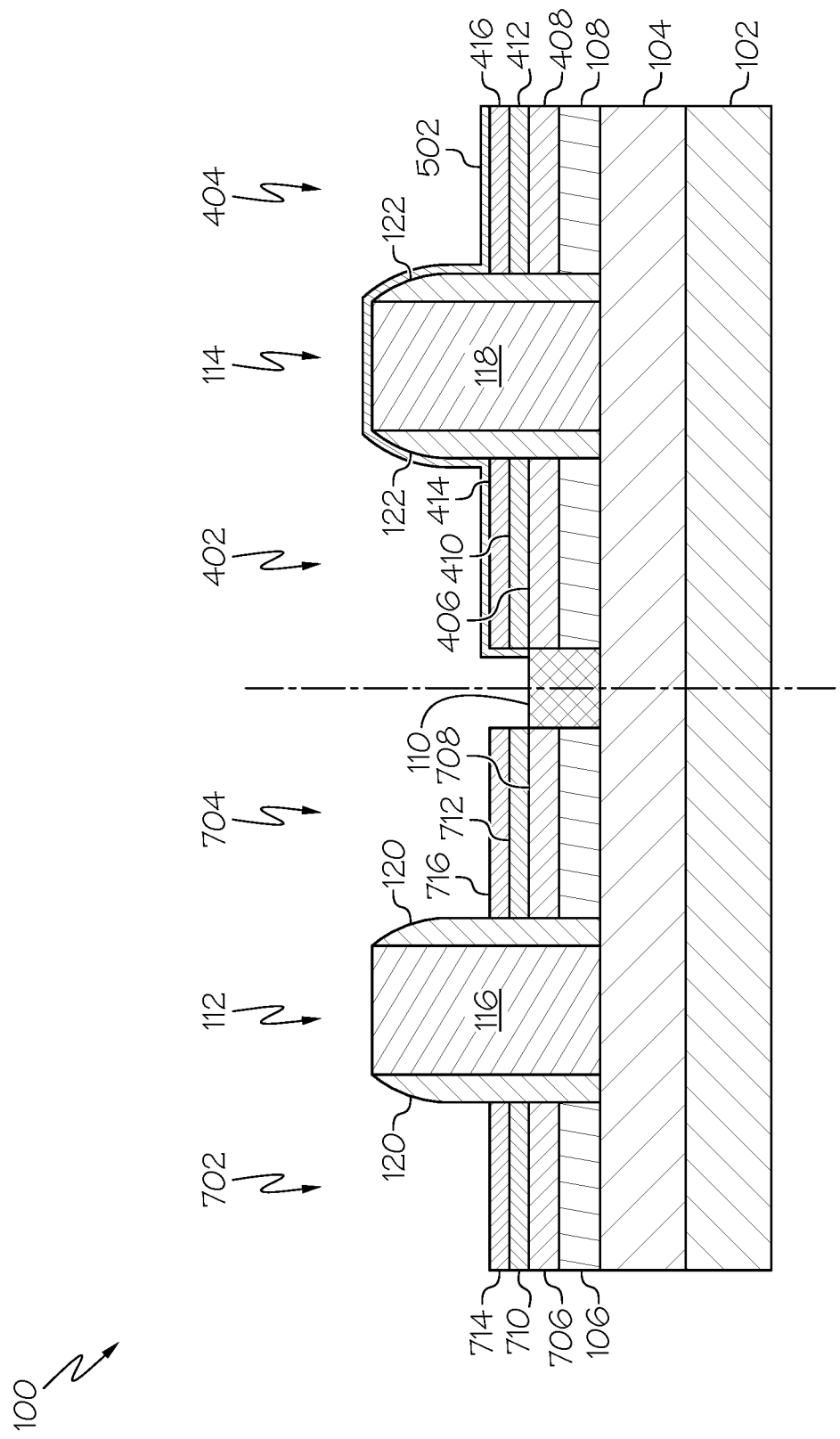
FIG. 7 is a cross-sectional view of the partial semiconductor structure in a seventh step of the continuing first example process of fabricating semiconductor devices.

As shown in FIG. 5, the process continues at step 1410 by depositing a silicon nitride cap 502 across the wafer 100, and then depositing a soft mask 602, as shown in FIG. 6, on the pFET device 114 to protect the pFET device region 114. Then, an etching step removes the silicon nitride cap 502 from the nFET device 112, as shown.

The fabrication process steps continuing for the nFET device 112 contacts 702, 704, are similar to those discussed above regarding the pFET device 114 contacts 402, 404, but now the various steps being repeated for the nFET device 112. A silicon nitride cap covers the dummy gates, spacers, and fins in the respective FET devices 112, 114. A soft mask is deposited on the pFET device 114. The silicon nitride cap is etched away and removed from the nFET device 112, and the nFET device 112 has the silicon fin 106 exposed. The fabrication process removes the soft mask that was protecting the pFET device 114. The pFET side is protected with the nitride cap. The fabrication process epitaxially grows semiconductor material to form source-drain contacts 702, 704, corresponding to the source-drain contact regions 706, 708, on the underlying substrate 106 of the nFET device 112.

Nickel is deposited across the wafer 100. On the nFET side this forms a thin Nickel film layer 710, 712 on the epitaxially grown source-drain contact regions 706, 708. The fabrication process then performs a third anneal to form a Nickel silicide film layer 710, 712 on the epitaxially grown source-drain contact regions 706, 708. The Nickel silicide film layer 710, 712 is formed with grains preferentially oriented to the underlying epitaxially grown source-drain contact regions 706, 708.

The process then deposits a second metal film layer 714, 716 on the Nickel silicide film layer 710, 712. The second metal film material can include for example, any one or more of the following: Tantalum (Ta), Titanium (Ti), Zirconium (Zr), Hafnium (Hf), Vanadium (Va), Niobium (Nb), Molybdenum (Mo), Tungsten (W), or the like. This deposition of the second metal film layer 714, 716 is followed by a fourth anneal to form the preferentially oriented second metal silicide film layer 714, 716 on top of the Nickel silicide film layer 710, 712. The second metal silicide film layer 714, 716 is formed with grains preferentially oriented to the first layer being the Nickel silicide film layer 710, 712, which is preferentially oriented to the underlying epitaxially grown source-drain contact regions 706, 708. That is, the orientation of the grains of the bottom textured silicide layer 710, 712 (e.g., of the preferentially oriented Nickel silicide material) defines the orientation of the top textured silicide layer 714, 716 (e.g., of the preferentially oriented second metal silicide material that can be selected from, for example, any one or more of Ta, Ti, Zr, Hf, Va, Nb, Mo, W, or the like). The bottom textured silicide layer 710, 712 forms a template on which the top textured silicide layer 714, 716 grows. The orientation of both textured silicide layers 710, 712, 714, 716 is determined by the orientation of the bottom textured silicide layer 710, 712.

The process then uses a wet chemistry to remove the unreacted metal from the pFET and nFET sides. Since the pFET region has been protected by the nitride cap, all of the unreacted metal deposited on the nitride cap will be removed.

Figure 8:
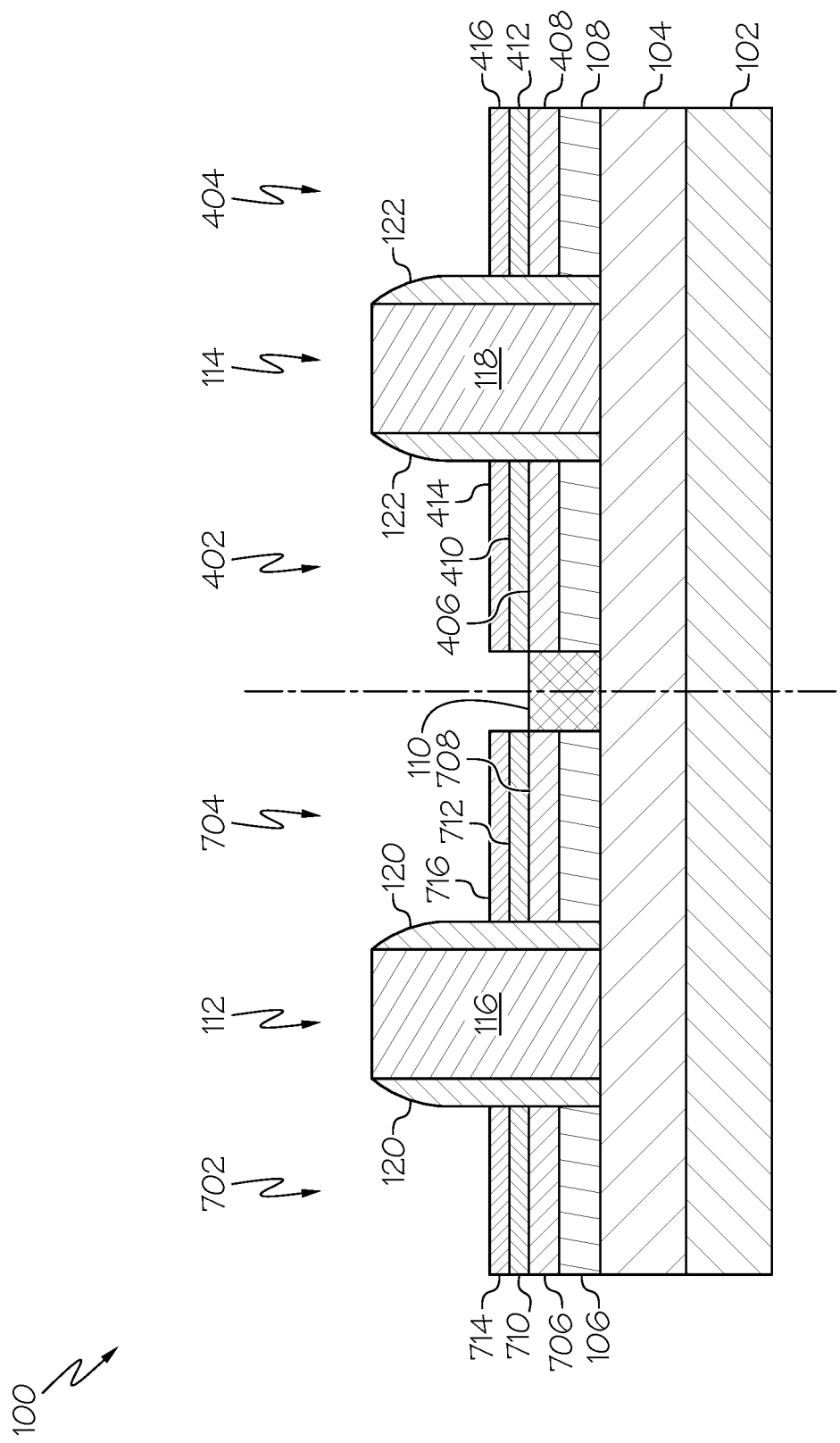
FIG. 8 is a cross-sectional view of the partial semiconductor structure in an eighth step of the continuing first example process of fabricating semiconductor devices.

In FIG. 8, the fabrication process is shown at a step in the process with the two textured silicide film layers 710, 712, 714, 716 formed in the nFET device 112 and the two textured silicide film layers 410, 412, 414, 416 formed in the pFET device 114. This step in the process follows the removal of the soft mask that was protecting the pFET device 114, and the etching away of the silicon nitride cap from the pFET device 114. This process is then exited at step 1412.

A conventional fabrication process then follows including replacing the dummy gates 116, 118 with actual gates in a process called replacement metal gate.

Late Silicide Example Process

The silicide formation, according to the example, occurs after the final gate structure is in place, as will be discussed below. This example semiconductor device fabrication process 1500 will be discussed below with reference to FIGS. 9 to 13 and 15, and to a semiconductor structure 900.

Figure 9:
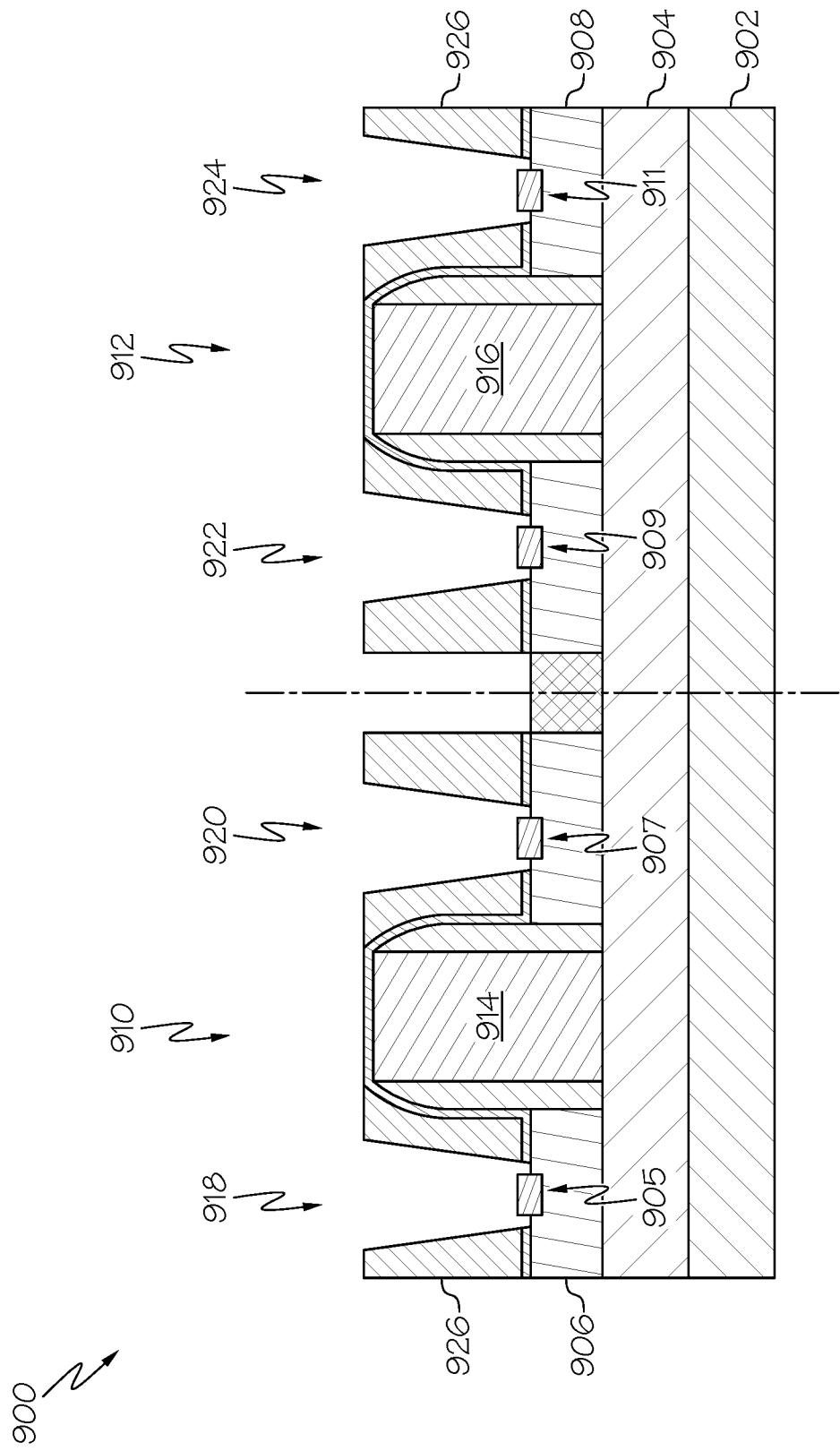
FIG. 9 is a cross-sectional view of a partial semiconductor structure in a first step of a second example process of fabricating semiconductor devices, according to an embodiment of the present invention.

As shown in FIG. 9, according to the fabrication process entered at step 1502 and proceeding to step 1504, etching is performed on the nFET device 910 contacts 918, 920, to open the source-drain contact regions 905, 907 on the fin 906 of the nFET device 910. Contemporaneously, etching is performed on the pFET device 912 contacts 922, 924, to open the source-drain contact regions 909, 911 on the fin 908 of the pFET device 912. The nFET semiconductor device 910 and the pFET semiconductor device 912 are disposed on a circuit supporting substrate 904 that is disposed on a substrate 902. The FET devices 910, 912, according to the example, are separated by dielectric material, e.g., by oxide deposition filling an etched region. Such dielectric material may comprise shallow trench isolation (STI) material.

Figure 10:
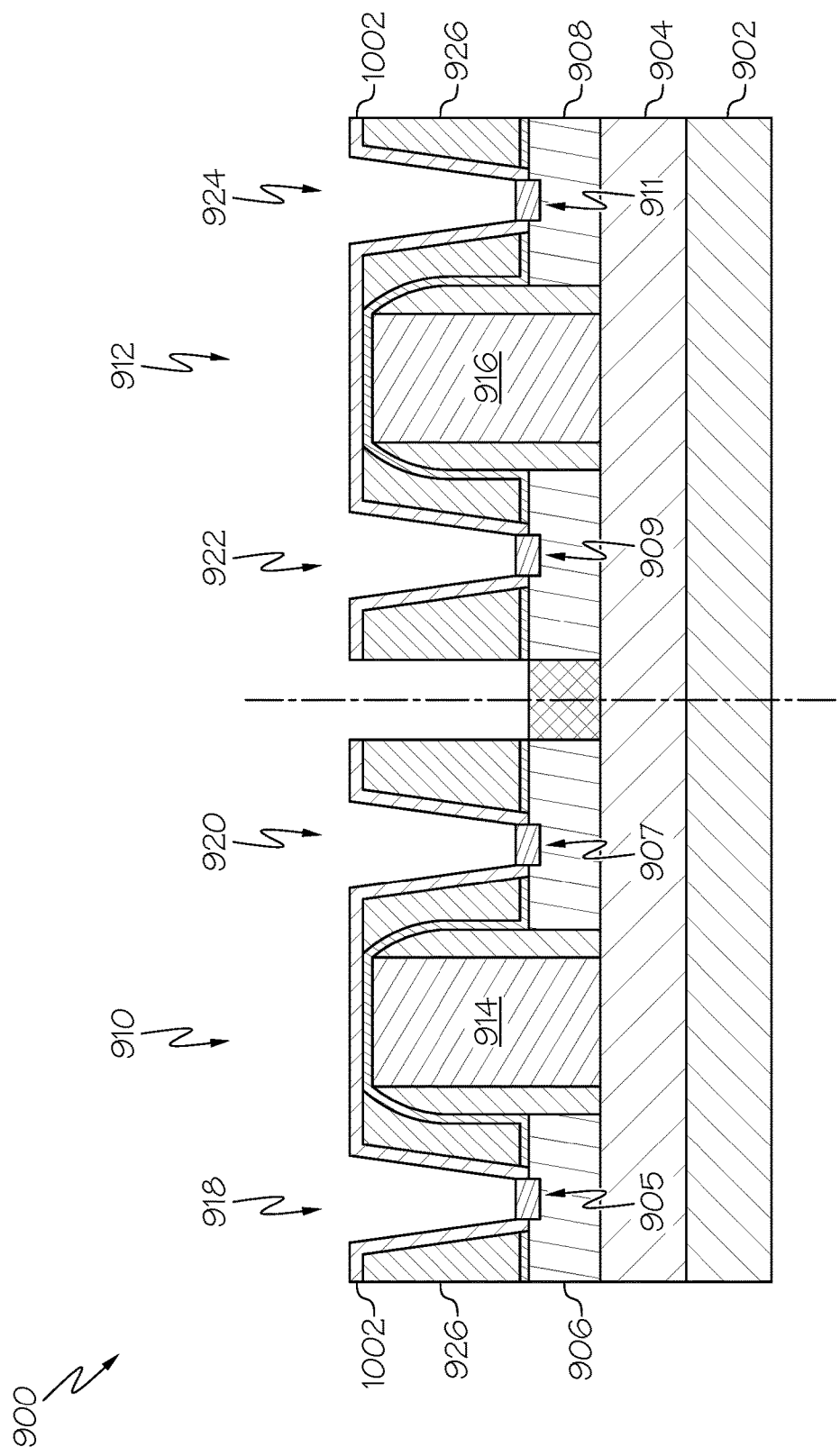
FIG. 10 is a cross-sectional view of the partial semiconductor structure in a second step of the continuing second example process of fabricating semiconductor devices.

As shown in FIG. 10, the fabrication process 1500 at step 1506 deposits a Nickel film layer 1002 on the nFET device 910 and the pFET device 912, resulting in the Nickel film layer 1002 being formed on the epitaxially grown source-drain contact regions 905, 907, 909, 911, respectively. Then, the fabrication process performs an optional anneal on the semiconductor structure 900, e.g., on the wafer. A Nickel silicide film or Nickel silicide germanide film is formed on the epitaxially grown source-drain contact regions 905, 907, 909, 911, respectively. It should be noted that the Nickel film layer (and accordingly the textured Nickel film layer) can be formed by at least one of physical vapor deposition, chemical vapor deposition, or atomic layer deposition.

Figure 11:
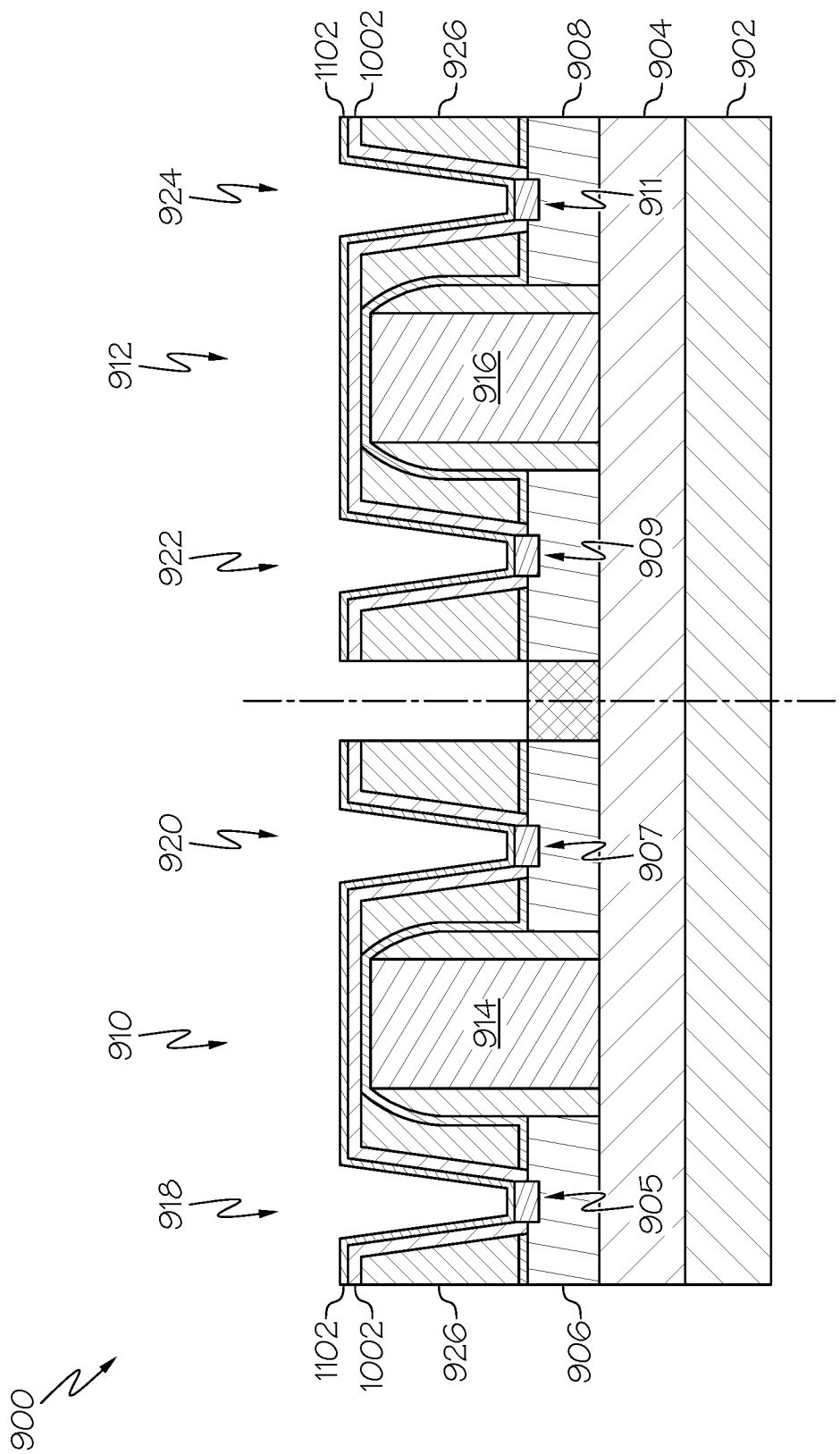
FIG. 11 is a cross-sectional view of the partial semiconductor structure in a third step of the continuing second example process of fabricating semiconductor devices.
Figure 12:
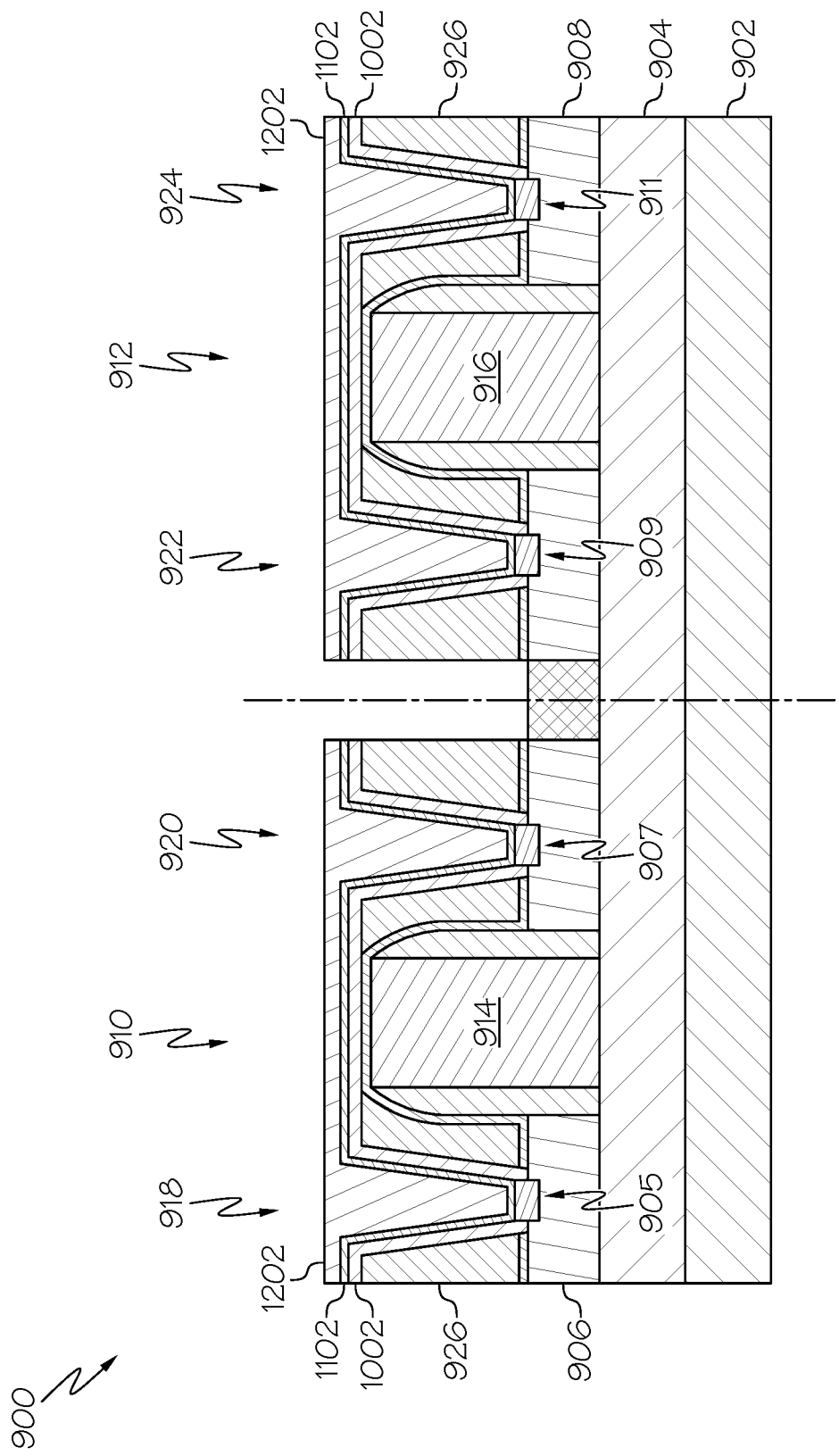
FIG. 12 is a cross-sectional view of the partial semiconductor structure in a fourth step of the continuing second example process of fabricating semiconductor devices.

Then, as shown in FIG. 11, the fabrication process at step 1508 continues by depositing a second metal film layer 1102 on the semiconductor structure 900. It should be noted that the second metal film layer (and accordingly the textured second metal silicide film layer) can be formed by at least one of physical vapor deposition, chemical vapor deposition, or atomic layer deposition. The second metal film material can include for example, any one or more of the following: Tantalum (Ta), Titanium (Ti), Zirconium (Zr), Hafnium (Hf), Vanadium (Va), Niobium (Nb), Molybdenum (Mo), Tungsten (W), or the like. This deposition is followed by an anneal to form the second preferentially oriented silicide film layer 1102 on top of the Nickel silicide layer 1002. The second metal silicide film layer is formed with grains preferentially oriented to the first silicide film layer being the Nickel silicide film layer 1002, which is preferentially oriented to the underlying epitaxially grown source-drain contact regions 905, 907, 909, 911, respectively. That is, the orientation of the grains of the bottom textured silicide layer 1002 (e.g., of the preferentially oriented Nickel silicide material or Nickel silicide germanide material) defines the orientation of the top silicide layer 1102 (e.g., of the preferentially oriented metal silicide material that can be selected from, for example, any one or more of Ta, Ti, Zr, Hf, Va, Nb, Mo, W, or the like). The bottom textured film layer 1002 forms a template on which the top textured film layer 1102 grows. The orientation of both textured film layers 1002, 1102 is determined by the orientation of the bottom textured film layer 1002.

Figure 13:
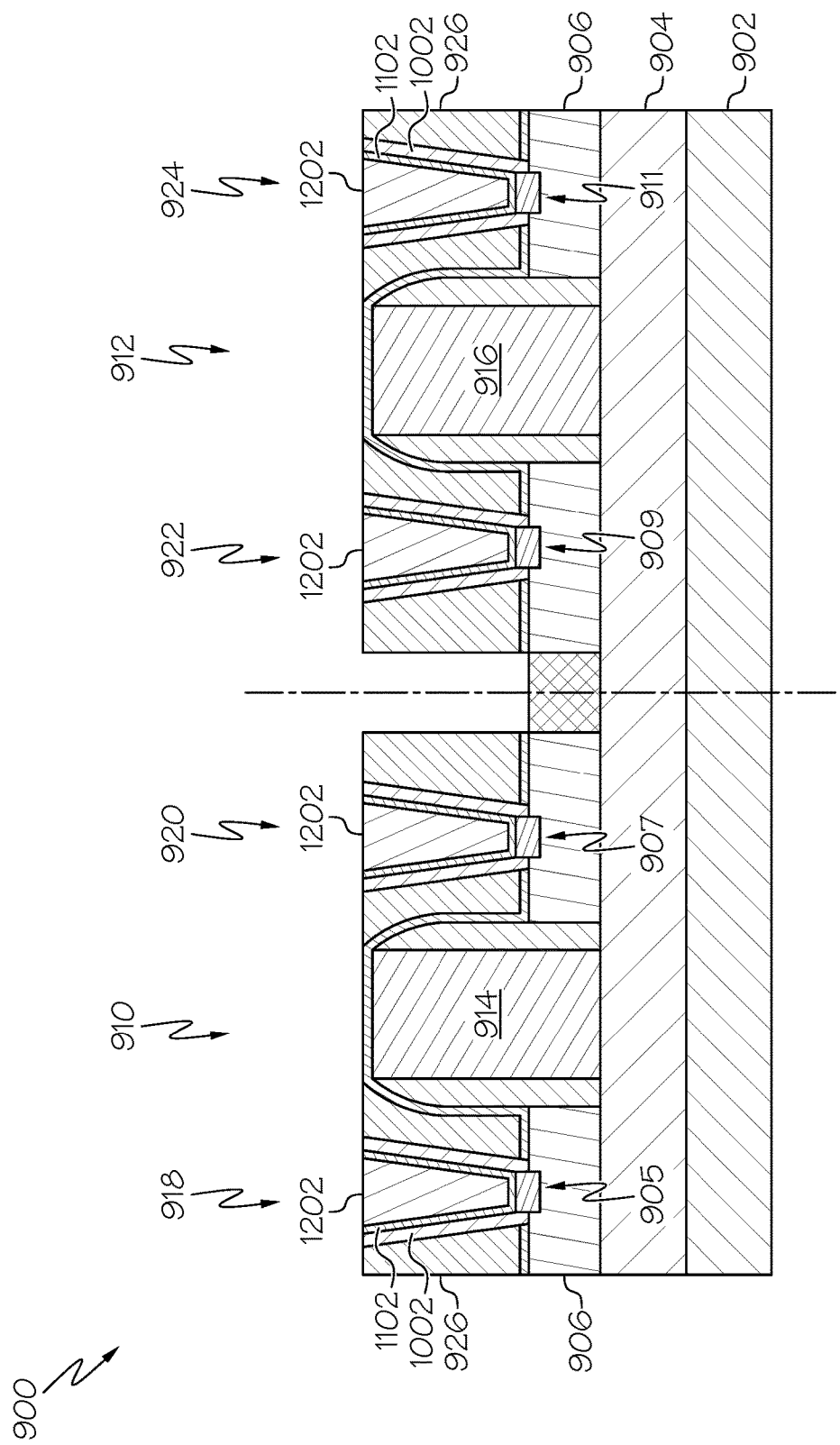
FIG. 13 is a cross-sectional view of the partial semiconductor structure in a fifth step of the continuing second example process of fabricating semiconductor devices.
Figure 14:
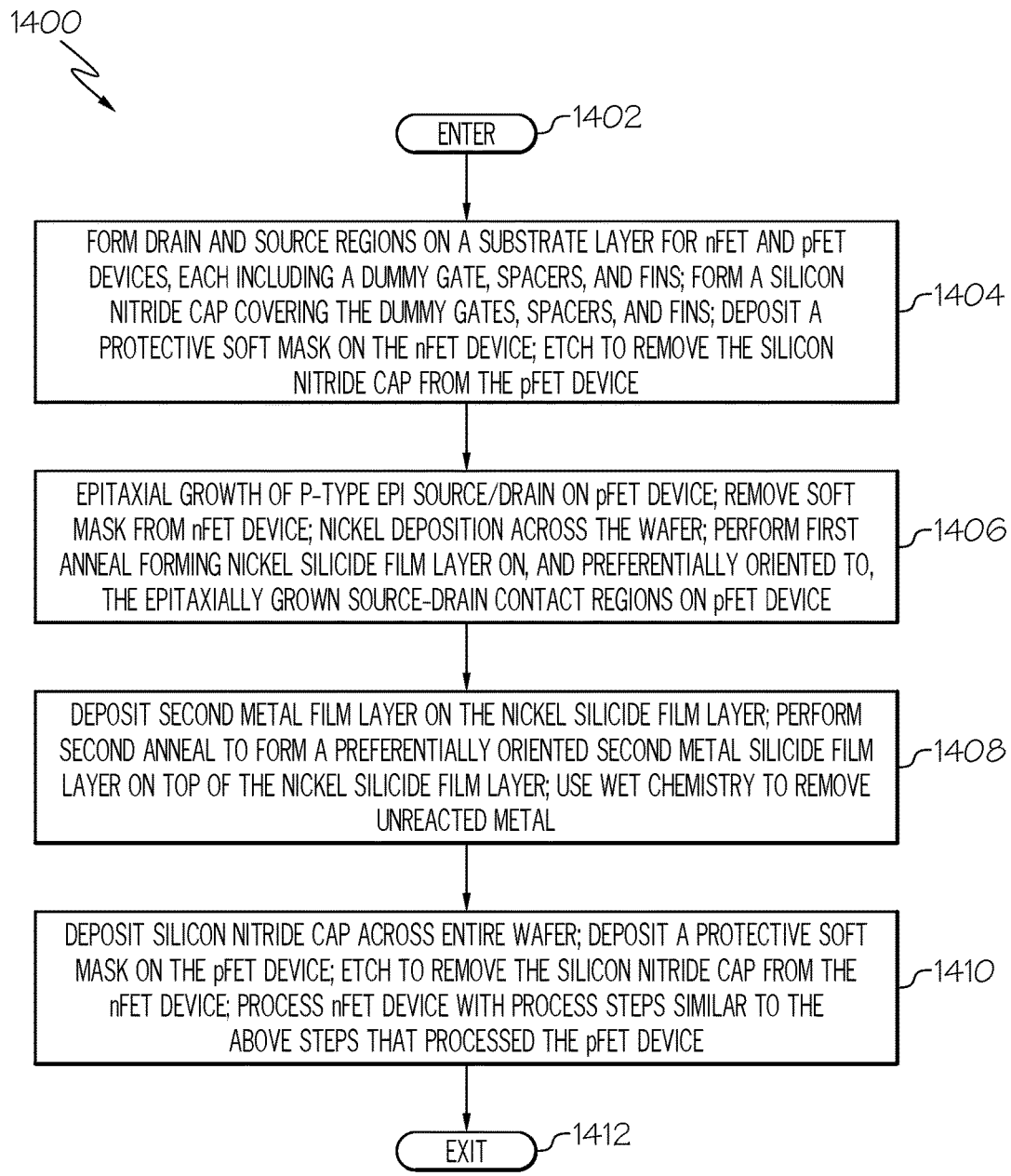
FIG. 14 is an operational flow diagram illustrating a first example process for fabricating semiconductor devices, according to an embodiment of the present invention.
Figure 15:
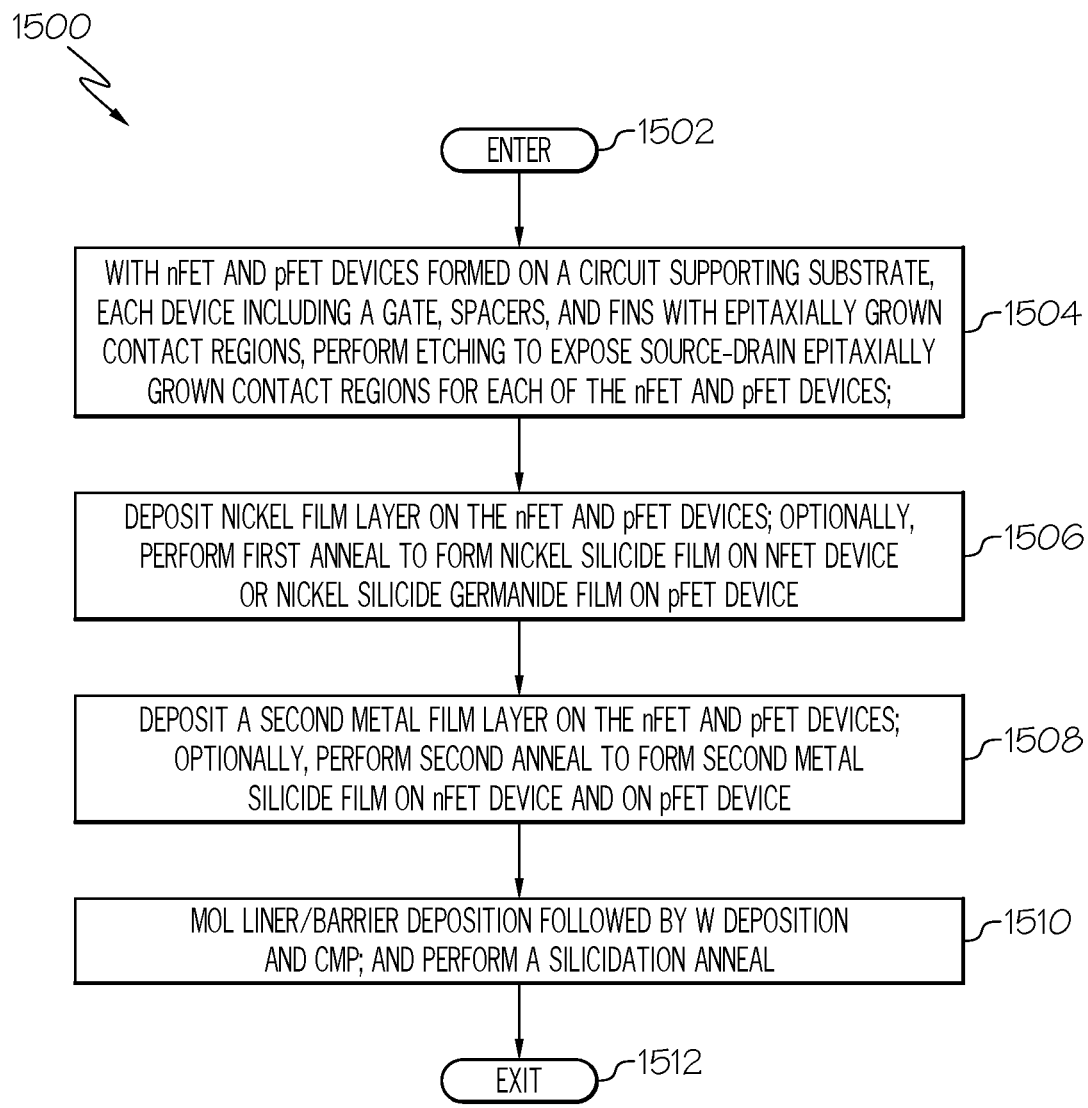
FIG. 15 is an operational flow diagram illustrating a second example process for fabricating semiconductor devices, according to an embodiment of the present invention.

After the second metal film layer is deposited, a liner/barrier layer (not shown in FIG. 11), such as of Titanium Nitride, is deposited, at step 1510, on the second metal film layer 1102. Then, a Tungsten deposition 1202 fills with conductive metal material the trench of the contacts 918, 920, 922, 924. Then, as shown in FIG. 13, chemical mechanical polishing (CMP) removes Tungsten from the top surface of the wafer 900, leaving Tungsten inside the contact metallization fill 1202. In summary, a Nickel textured silicide film layer and a textured silicide contact layer can be formed through trench or via contacts of an nFET device or a pFET device, such as after having performed a replacement metal gate fabrication process for the nFET device or the pFET device.

Then, according to the example fabrication process, a silicidation anneal can be performed on the wafer 900 which forms the two layers of silicide metals 1002, 1102 at the bottom of the contact trench 918, 920, 922, 924. Some unreacted metal from the top layer may remain after the anneal. Unreacted metal does not need to be removed. The process is then exited at step 1512.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements can apply to some inventive features but not to others.

What is claimed is:

1. A semiconductor structure comprising:
a semiconductor substrate;
at least one epitaxially grown source-drain contact region disposed on the semiconductor substrate;
a top textured silicide film layer disposed on the at least one epitaxially grown source-drain contact region, the top textured silicide film layer having a preferred grain orientation that is oriented to a grain orientation of the at least one epitaxially grown source-drain contact region; and
an interfacial bottom textured silicide film layer interposed between the top textured silicide film layer and the at least one epitaxially grown source-drain contact region.

2. The semiconductor structure of claim 1, wherein the bottom textured silicide film layer is chemically different from the top textured silicide film layer.

3. The semiconductor structure of claim 1, wherein
the at least one epitaxially grown source-drain contact region comprises a plurality of epitaxially grown source-drain contact regions; and
for each of the plurality of epitaxially grown source-drain contact regions:
a top textured silicide film layer is disposed on the respective each epitaxially grown source-drain contact region, the top textured silicide film layer having a preferred grain orientation that is oriented to a grain orientation of the respective each epitaxially grown source-drain contact region; and
an interfacial bottom textured silicide film layer is interposed between the top textured silicide film layer and the respective each epitaxially grown source-drain contact region.

4. The semiconductor structure of claim 1, wherein the top textured silicide film layer comprises morphologically stable silicide contact material that withstands high temperature processing in a semiconductor fabrication process.

5. The semiconductor structure of claim 1, wherein the top textured silicide film layer constitutes at least one contact for at least one of the following circuit elements:
an nFET device;
a pFET device; or
a CMOS device.

6. The semiconductor structure of claim 5, wherein the top textured silicide film layer constitutes at least one contact for at least one of the following:
an integrated circuit chip;
a CMOS integrated circuit on a chip;
a multichip package;
an end product including a plurality of integrated circuit chips;
a wafer including a plurality of unpackaged chips; and
a combination of any of the above.

7. The semiconductor structure of claim 1, including:
at least one epitaxially grown gate contact region that is disposed on the semiconductor substrate;
at least one top textured silicide film layer disposed on the at least one epitaxially grown gate contact region; and an interfacial bottom textured silicide film layer interposed between the top textured silicide film layer and the at least one epitaxially grown gate contact region, the top textured silicide film layer, the at least one epitaxially grown gate contact region, and the interfacial bottom textured silicide film layer interposed therebetween, forming at least one gate contact for at least one FET device.

8. The semiconductor structure of claim 1, wherein the interfacial bottom textured silicide film layer and the top textured silicide film layer wrap around the at least one epitaxially grown source-drain contact region thereby forming a wrap-around contact with increased contact length and lower contact resistance.

9. A semiconductor fabrication process for forming at least one textured silicide contact, the process comprising:
following epitaxially growing a contact region on a semiconductor substrate, wherein the contact region comprises one contact region selected from the set of:
a source-drain contact region, or
a gate contact region, perform deposition of a bottom textured silicide film layer having one orientation on the epitaxially grown contact region; and
following the deposition of the bottom textured silicide film layer, perform deposition of a top textured silicide film layer having the one orientation on the bottom textured silicide film layer, the bottom textured silicide film layer interposed between the top textured silicide film layer and the epitaxially grown contact region; and
using a soft mask to selectively protect one of an nFET device or a pFET device, while performing the deposition of the bottom textured silicide film layer and the deposition of the top textured silicide film layer for forming a textured silicide contact for the other one of the nFET device or the pFET device.

10. The process of claim 9, wherein the top textured silicide film layer comprises morphologically stable silicide contact material that withstands high temperature processing in a semiconductor fabrication process.

11. The process of claim 9, wherein the top textured silicide film layer constitutes a contact for at least one of the following circuit elements:
an nFET device;
a pFET device; or
a CMOS device.

12. The process of claim 9, wherein the bottom textured silicide film layer is formed by at least one of physical vapor deposition, chemical vapor deposition, or atomic layer deposition.

13. The process of claim 9, wherein the top textured silicide film layer is formed by at least one of physical vapor deposition, chemical vapor deposition, or atomic layer deposition.

14. The process of claim 9, wherein all of the steps are performed before performing a replacement metal gate fabrication process for at least one device selected from a set of an nFET device and a pFET device.

15. The process of claim 9, wherein the bottom textured silicide film layer and the top textured silicide film layer are formed through trench or via contacts of one of an nFET device or a pFET device after having performed a replacement metal gate fabrication process for the nFET device or the pFET device.

16. The process of claim 9, wherein the bottom textured silicide film layer comprises a low concentration alloy combined with silicide Nickel metal.

17. The process of claim 9 wherein the top textured silicide film layer comprises a silicide metal that is chemically different from the bottom textured silicide film layer.

18. The process of claim 17, wherein the silicide metal in the top textured silicide film layer comprises one or more silicide metals selected from the following: Tantalum (Ta), Titanium (Ti), Zirconium (Zr), Hafnium (Hf), Vanadium (Va), Niobium (Nb), Molybdenum (Mo), Tungsten (W), or the like.

19. A semiconductor structure comprising:
a semiconductor substrate;
at least one epitaxially grown gate contact region disposed on the semiconductor substrate;
a top textured silicide film layer disposed on the at least one epitaxially grown gate contact region, the top textured silicide film layer having a preferred grain orientation that is oriented to a grain orientation of the at least one epitaxially grown gate contact region; and
an interfacial bottom textured silicide film layer interposed between the top textured silicide film layer and the at least one epitaxially grown gate contact region.

20. The semiconductor structure of claim 19, wherein the interfacial bottom textured silicide film layer is chemically different from the top textured silicide film layer.

\* \* \* \* \*